United States Patent
Tseng

(10) Patent No.: US 11,015,087 B2
(45) Date of Patent: May 25, 2021

(54) POLISHING COMPOSITION, METHOD FOR PRODUCING POLISHING COMPOSITION, POLISHING METHOD, AND METHOD FOR PRODUCING SEMICONDUCTOR SUBSTRATE

(71) Applicant: FUJIMI INCORPORATED, Kiyosu (JP)

(72) Inventor: Tzu-Chun Tseng, Tongluo Township (TW)

(73) Assignee: FUJIMI INCORPORATED, Kiyosu (JP)

( * ) Notice: Subject to any disclaimer, the term of this patent is extended or adjusted under 35 U.S.C. 154(b) by 0 days.

(21) Appl. No.: 16/133,686

(22) Filed: Sep. 17, 2018

(65) Prior Publication Data

US 2019/0092974 A1    Mar. 28, 2019

(30) Foreign Application Priority Data

Sep. 26, 2017   (JP) .............................. JP2017-185460

(51) Int. Cl.
| | | |
|---|---|---|
| *C09G 1/02* | (2006.01) | |
| *H01L 21/321* | (2006.01) | |
| *H01L 21/3105* | (2006.01) | |
| *C09G 1/00* | (2006.01) | |
| *C09K 3/14* | (2006.01) | |
| *G01G 1/06* | (2006.01) | |
| *G09G 1/04* | (2006.01) | |
| *B24B 1/00* | (2006.01) | |
| *C09K 13/06* | (2006.01) | |
| *B24B 37/04* | (2012.01) | |
| *H01L 21/306* | (2006.01) | |

(52) U.S. Cl.
CPC .................. *C09G 1/02* (2013.01); *B24B 1/00* (2013.01); *B24B 37/044* (2013.01); *C09G 1/00* (2013.01); *C09K 3/1454* (2013.01); *C09K 3/1463* (2013.01); *C09K 13/06* (2013.01); *G01G 1/06* (2013.01); *G09G 1/04* (2013.01); *H01L 21/30625* (2013.01); *H01L 21/31053* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 2003/0166338 A1 | 9/2003 | Ahn et al. | |
| 2006/0163530 A1* | 7/2006 | Liu ..................... | H01L 21/3212 252/79.1 |
| 2007/0149097 A1* | 6/2007 | Fujii .................... | C09K 3/1409 451/41 |
| 2007/0251156 A1* | 11/2007 | Siddiqui .............. | C09K 3/1409 51/307 |
| 2008/0120918 A1* | 5/2008 | Hattori ................ | C09G 1/02 51/308 |
| 2008/0188079 A1* | 8/2008 | Kato .................. | C09G 1/02 438/693 |
| 2009/0107520 A1* | 4/2009 | Lee ..................... | C11D 11/0047 134/2 |
| 2013/0183889 A1 | 7/2013 | Yoneda et al. | |
| 2015/0221521 A1 | 8/2015 | Hou et al. | |

FOREIGN PATENT DOCUMENTS

| | | |
|---|---|---|
| JP | 2003-277734 A | 10/2003 |
| JP | 2008-135452 A | 6/2008 |
| JP | 2008-192930 A | 8/2008 |
| JP | 2012-143823 A | 8/2012 |
| JP | 2014-022511 A | 2/2014 |

OTHER PUBLICATIONS

Office Action issued in corresponding Japanese Patent Application No. 2017-185460 dated Mar. 23, 2021 with English translation.

* cited by examiner

*Primary Examiner* — Jiong-Ping Lu

(74) *Attorney, Agent, or Firm* — Foley & Lardner LLP

(57) ABSTRACT

A polishing composition according to the present invention includes: silica; an anionic water-soluble polymer; at least one compound selected from the group consisting of a phosphonate group-containing compound, a phosphate group-containing compound, and an amino group-containing compound; and a dispersing medium.

10 Claims, No Drawings

POLISHING COMPOSITION, METHOD FOR PRODUCING POLISHING COMPOSITION, POLISHING METHOD, AND METHOD FOR PRODUCING SEMICONDUCTOR SUBSTRATE

CROSS-REFERENCE TO RELATED APPLICATION

Background

1. Technical Field

The present invention relates to a polishing composition, a method for producing a polishing composition, a polishing method, and a method for producing a semiconductor substrate.

2. Description of Related Arts

In recent years, a so-called chemical mechanical polishing (CMP) technique for physically polishing and flattening a semiconductor substrate in producing a device is used in accordance with multilayer wiring on a surface of a semiconductor substrate. CMP is a method for flattening a surface of an object to be polished (material to be polished) such as a semiconductor substrate by using a polishing composition (slurry) containing abrasive grains of silica, alumina, ceria, or the like, an anti-corrosion agent, a surfactant, and the like. Specifically, CMP is used in processes such as shallow trench isolation (STI), flattening of interlayer insulating films (ILD films), formation of tungsten plugs, and formation of multilayer wires composed of copper and a low dielectric film. In such CMP, it is required that an insulating film (such as silicon nitride) and an electric conductive material (such as titanium nitride) are removed by polishing with a high polishing selectivity (that is, the insulating film such as silicon nitride is removed at a higher polishing speed than that of the electric conductive material such as titanium nitride).

As a means for increasing polishing selectivity between silicon nitride and titanium nitride, it is considered that a polishing speed of titanium nitride is suppressed. For example, US 2015/221,521 A discloses that a polishing speed of titanium nitride is suppressed by using a polishing composition containing abrasive grains and a surfactant.

SUMMARY

However, the present inventor has found that when the object to be polished containing silicon nitride and titanium nitride is polished by using the polishing composition described in US 2015/221,521 A, a high polishing speed ratio between silicon nitride and titanium nitride is not still obtained particularly under a strong acidic condition (pH 2.5 or less).

The present invention is made in view of the above-described problems, and an object thereof is to provide a polishing composition having a sufficiently high polishing speed of silicon nitride with respect to a polishing speed of titanium nitride (that is, selectivity of silicon nitride/titanium nitride is high) even under a strong acidic condition (pH 2.5 or less).

The present inventor has conducted intensive studies in view of the above-described problems. Consequently, the inventor found that the above-described problems can be solved by using a polishing composition including: silica; an anionic water-soluble polymer; at least one compound selected from the group consisting of a phosphonate group-containing compound, a phosphate group-containing compound, and an amino group-containing compound; and a dispersing medium, and achieved the present invention.

DETAILED DESCRIPTION

Hereinafter, the present invention will be described. Incidentally, the present invention is not limited only to the following embodiments. In addition, in the present specification, unless specifically described otherwise, operations and measurements of physical properties and the like are performed under conditions of room temperature (20° C. or higher and 25° C. or lower)/relative humidity of 40% RH or higher and 50% RH or lower.

Incidentally, in the present specification, in specific compound names, notation "(meth)acrylic" means "acrylic" and "methacrylic" and notation "(meth)acrylate" means "acrylate" and "methacrylate."

A polishing composition according to the present invention is expected to be also effective to a general object to be polished containing an insulating film and an electric conductive material. Examples of the insulating film include silicon oxide and silicon nitride. Examples of the electric conductive material include titanium, titanium nitride, tantalum, and tantalum nitride. Of them, an object to be polished containing silicon nitride (SiN) and titanium nitride (TiN) is preferable since the polishing composition exhibits significant effect with respect to the object to be polished. Specific examples of the object to be polished containing silicon nitride (SiN) and titanium nitride (TiN) include a semiconductor substrate having a structure in which a titanium nitride film is formed on a silicon nitride film and a semiconductor substrate having a structure in which all of a silicon nitride film and a titanium nitride film are exposed.

Herein, from the viewpoint of the effect exhibited by the present invention, it is preferable that the polishing composition according to an embodiment of the present invention is used in a step of polishing an object to be polished containing silicon nitride and titanium nitride. The reason for this is speculated that in such an object to be polished, a polishing suppression action by the anionic water-soluble polymer along with at least one compound selected from the group consisting of a phosphonate group-containing compound, a phosphate group-containing compound, and an amino group-containing compound becomes stronger due to an action mechanism described below.

The present inventor speculates the mechanism that the above-described problems are solved by the present invention to be as follows. However, the following mechanism is merely speculation, and the scope of the invention is not intended to be limited by the mechanism.

The polishing composition according to the present invention has a function of suppressing the polishing speed of titanium nitride as a result of interaction between each component contained in the polishing composition and the object to be polished. The polishing composition according to the present invention contains silica, an anionic water-soluble polymer, at least one compound selected from the group consisting of a phosphonate group-containing compound, a phosphate group-containing compound, and an amino group-containing compound (hereinafter, simply also referred to as a TiN inhibitor), and a dispersing medium. In a case where pH is acidic, since the surface of the titanium nitride film is positively charged, the anionic water-soluble polymer is adsorbed to the titanium nitride film to form a protective film on the surface of the titanium nitride film so that polishing of titanium nitride can be suppressed. However, as pH becomes more acidic, adsorption of the anionic water-soluble polymer to titanium nitride becomes weak, and thus the polishing speed of titanium nitride cannot be sufficiently suppressed. In this regard, the present inventor has conducted intensive studies and found that the polishing speed of titanium nitride can be suppressed by further adding the TiN inhibitor. The reason for this is as follows. The TiN inhibitor is polarized into a part having a positive electric charge and a part having a negative electric charge. The part having a negative electric charge can be strongly adsorbed to the surface of the titanium nitride film even under the strong acidic condition, but has a small molecular weight and does not sufficiently coat the surface of titanium nitride. However, when the TiN inhibitor and the anionic water-soluble polymer are concurrently used, the anionic water-soluble polymer is further electrically adsorbed to the part having a positive electric charge of the TiN inhibitor. Therefore, by concurrently using the TiN inhibitor and the anionic water-soluble polymer, the surface of the titanium nitride film can be sufficiently coated even under the strong acidic condition, the protective film is formed, and thus the polishing speed can be suppressed. In particular, such an effect is significantly exhibited under a strong acidic condition with pH of 2.5 or less. From the above description, it is considered that since the polishing composition of the present invention can suppress the polishing speed of titanium nitride while polishing silicon nitride at a high speed, a high polishing selectivity between silicon nitride and titanium nitride can be realized. Thus, according to the present invention, there is provided a polishing composition having a sufficiently high polishing speed of silicon nitride with respect to a polishing speed of titanium nitride (that is, selectivity of silicon nitride/titanium nitride is high) even under a strong acidic condition (pH 2.5 or less).

(Silica)

The polishing composition according to the present invention contains silica. The silica contained in the polishing composition has an action of mechanically polishing an object to be polished. The type of silica is not particularly limited, and examples thereof include colloidal silica, fumed silica, and sol-gel method silica. Among these, from the viewpoint that solid-phase reaction between the polishing composition and the object to be polished can be efficiently exerted, colloidal silica is preferable.

Examples of a method for producing colloidal silica include a silicate soda method and a sol-gel method, and colloidal silica produced by any production method may be used. In addition, examples of commercially available products of colloidal silica include colloidal silicas manufactured by Nissan Chemical Industries, Ltd., JGC Catalysts and Chemicals Ltd., NIPPON CHEMICAL INDUSTRIAL CO., LTD., FUSO CHEMICAL CO., LTD., ADEKA CORPORATION, Akzo Nobel Co., Ltd., AZ Electronic Materials, Nalco Chemical Company, and W. R. Grace & Co.-Conn.

The lower limit of the average primary particle size of silica is preferably 6 nm or more, more preferably 8 nm or more, and further preferably 10 nm or more. With such a range, since a high polishing speed can be maintained, silica can be suitably used in a rough polishing process or the like. In addition, the upper limit of the average primary particle size of silica is preferably 200 nm or less, more preferably 100 nm or less, further preferably 50 nm or less, and particularly preferably 30 nm or less. With such a range, it is possible to further suppress occurrence of defects on the surface of the object to be polished after polishing. Incidentally, the average primary particle size of silica is calculated, for example, on the basis of a specific surface area of silica measured by a BET method.

The lower limit of the average secondary particle size of silica is preferably 15 nm or more, more preferably 20 nm or more, and further preferably 25 nm or more. With such a range, since a high polishing speed can be maintained, silica can be suitably used in the rough polishing process. In addition, the upper limit of the average secondary particle size of silica is preferably 300 nm or less, more preferably 200 nm or less, further preferably 100 nm or less, and particularly preferably 50 nm or less. With such a range, it is possible to further suppress occurrence of defects on a surface of a silicon wafer after polishing. The average secondary particle size of silica can be measured, for example, by a dynamic light scattering method.

The content of silica is preferably 0.1% by mass or more, more preferably 0.5% by mass or more, even more preferably 1.0% by mass or more, and particularly preferably 1.4% by mass or more with respect to the polishing composition. With such a range, a high polishing speed can be maintained, and silica can be suitably used in the rough polishing process or the like. In addition, from the viewpoint of scratch prevention or the like, the content of silica is typically properly 10% by mass or less, preferably 5% by mass or less, more preferably 4% by mass or less, and particularly preferably 3% by mass or less. A smaller content of silica is preferable also from the viewpoint of economic efficiency.

(Dispersing Medium)

The polishing composition according to the present invention contains a dispersing medium for dispersing or dissolving each component. As the dispersing medium, it is preferable that water does not contain impurities as much as possible from the viewpoint of inhibiting contamination of the object to be cleaned and action of other components. As such water, for example, water in which the total content of transition metal ions is 100 ppb or less is preferable. Herein, the purity of water can be increased, for example, by an operation such as removing impurity ions using an ion exchange resin, removing foreign substances using a filter, or distillation. Specifically, as water, for example, deionized water (ion-exchanged water), pure water, ultrapure water, distilled water, and the like are preferably used.

The dispersing medium may be a mixed solvent of water and an organic solvent in order to disperse or dissolve each component. In this case, examples of the organic solvent to be used include acetone, acetonitrile, ethanol, methanol, isopropanol, glycerin, ethylene glycol, and propylene glycol that are organic solvents mixing with water. In addition, these organic solvents may be used without being mixed with water, and may be mixed with water after each component is dispersed or dissolved. These organic solvents can be used either singly or in combination of two or more kinds thereof.

(Anionic Water-Soluble Polymer)

The polishing composition according to the present invention contains an anionic water-soluble polymer. The anionic water-soluble polymer in the polishing composition is adsorbed to a surface of a titanium nitride layer when the polishing composition is used for polishing the object to be polished. According to this, the polishing composition according to the present invention can suppress the polishing speed of titanium nitride.

Examples of an anionic group of the anionic water-soluble polymer include a carboxylic group (carboxyl group), a sulfonic group, a sulfuric acid ester group, a phosphoric acid ester group, and a phosphonate group, but from the viewpoint of reducing scratches and particles, the anionic water-soluble polymer preferably has a carboxylic group and more preferably has only a carboxylic group. That is, in the present invention, the anionic water-soluble polymer is preferably polycarboxylic acid. Incidentally, these anionic groups may be in the form of a neutralized salt.

Examples of a water-soluble polymer having a carboxylic group include a (co) polymer having a constituent unit derived from a monomer having a carboxylic group and a salt thereof. Examples of the monomer having a carboxylic group include itaconic acid, (meth)acrylic acid, maleic acid, and salts thereof. In the anionic water-soluble polymer, two or more kinds of constituent unit derived from a monomer having a carboxylic group may be contained. Of them, as the anionic water-soluble polymer, poly(meth)acrylic acid, a (meth)acrylic acid-maleic acid copolymer, or a salt thereof is exemplified.

The anionic water-soluble polymer may contain a constituent unit component derived from a monomer other than the anionic group-containing monomer within the range that the effect of the present invention is exhibited.

The content of the anionic water-soluble polymer in the polishing composition is preferably 1 ppm by mass or more, more preferably 10 ppm by mass or more, further preferably 100 ppm by mass or more, even more preferably 1000 ppm by mass or more, and particularly preferably 2000 ppm by mass or more. As the content of the anionic water-soluble polymer increases, the anionic water-soluble polymer adsorbed on the titanium nitride film increases so that the polishing speed of titanium nitride can be effectively suppressed.

The content of the anionic water-soluble polymer in the polishing composition is also preferably 100000 ppm by mass or less, more preferably 10000 ppm by mass or less, further preferably 8000 ppm by mass or less, even more preferably 6000 ppm by mass or less, and particularly preferably 4000 ppm by mass or less. As the content of the water-soluble polymer decreases, the abrasive grains in the polishing composition are less likely to aggregate. Thus, this provides an advantageous effect of improving the storage stability of the polishing composition.

The weight average molecular weight (Mw) of the anionic water-soluble polymer in the polishing composition is preferably 1000 or more, more preferably 1500 or more, further preferably 2000 or more, further preferably 3000 or more, even more preferably 4000 or more, and particularly preferably 4500 or more. As the molecular weight of the anionic water-soluble polymer increases, the sufficient amount of the polymer to suppress the polishing speed of the titanium nitride layer by the polishing composition is easily adsorbed on the surface of the titanium nitride layer.

The weight average molecular weight (Mw) of the anionic water-soluble polymer in the polishing composition is preferably 10000 or less, more preferably 6000 or less, further preferably 5500 or less, even more preferably 5400 or less, and particularly preferably 5300 or less. As the molecular weight of the water-soluble polymer decreases, the abrasive grains in the polishing composition are less likely to aggregate. Thus, this provides an advantageous effect of improving the storage stability of the polishing composition. As the weight average molecular weight of the polymer compound, a value of the weight average molecular weight (in terms of polyethyleneglycol) measured by gel permeation chromatography (GPC) was used. The weight average molecular weight was measured by the following apparatus and conditions.

GPC apparatus: manufactured by SHIMADZU CORPORATION
Model: Prominence+ELSD detector (ELSD-LTII)
Column: VP-ODS (manufactured by SHIMADZU CORPORATION)
Mobile phase A: MeOH
B: aqueous solution of 1% acetic acid
Flow rate: 1 ml/min
Detector: ELSD temp. 40° C., Gain 8, N2 GAS 350 kPa
Oven temperature: 40° C.
Injection amount: 40 μL
(TiN Inhibitor)

The polishing composition according to the present invention contains at least one compound selected from the group consisting of a phosphonate group-containing compound, a phosphate group-containing compound, and an amino group-containing compound as a TiN inhibitor. In addition, as described above, although the polishing speed of titanium nitride can be suppressed by addition of the anionic water-soluble polymer, the polishing speed of titanium nitride can be further suppressed by adding the TiN inhibitor.

As the pH of the polishing composition becomes more strongly acidic, even when only the anionic water-soluble polymer is used, the suppression of the polishing speed of titanium nitride is not sufficient. In this regard, when the TiN inhibitor and the anionic water-soluble polymer are concurrently used, the surface of the titanium nitride film can be sufficiently coated even under the strong acidic condition, and the polishing speed can be suppressed by forming a protective film. Incidentally, either only one or a plurality of kinds of the TiN inhibitor may be used.

As the phosphonate group-containing compound which can be used as the TiN inhibitor, a compound having one to six phosphonate groups is preferably exemplified. Specifically, examples of a compound having one phosphonate group include phosphonic acid, methyl phosphonic acid, phenyl phosphonic acid, and 1-naphthylmethyl phosphonic acid. In addition, examples of a compound having two phosphonate groups include methylene diphosphonic acid (MDPNA), ethylene diphosphonic acid (EDPNA), 1-hydroxyethane-1,1-diphosphonic acid (etidronic acid, HEDP), nitrilotris(methylenephosphonic acid) (NTMP), ethylenediamine tetraphosphonic acid, ethylenediamine tetramethylene phosphonic acid (EDTMP), and diethylenetriamine penta(methylenephosphonic acid) (DTPMP). Of the phosphonate group-containing compounds, compounds having two or more, preferably three to five phosphonate groups in one molecule are preferable. For example, it is particularly preferable that the phosphonate group-containing compound is nitrilotris(methylenephosphonic acid) (NTMP), ethylenediamine tetramethylene phosphonic acid (EDTMP), and diethylenetriamine penta(methylenephosphonic acid) (DTPMP).

Examples of the phosphate group-containing compound which can be used as the TiN inhibitor include an inorganic phosphoric acid compound and an organic phosphoric acid compound. Specific examples of the inorganic phosphoric acid compound include monophosphoric acids such as phosphoric acid (orthophosphoric acid), phosphorous acid, and hypophosphorous acid, polyphosphoric acids such as pyrophosphoric acid, pyrophosphorous acid, triphosphoric acid, tetraphosphoric acid, hexaphosphoric acid, cyclophosphoric acid, metaphosphoric acid, and hexametaphosphoric acid, and salts thereof. Specific examples of the organic phosphoric acid compound include alkyl phosphoric acid esters such as tetradecylphosphoric acid, hexadecylphosphoric acid, octadecylphosphoric acid, didecylphosphoric acid, 10-methacryloyloxy decyl dihydrogen phosphate, 12-acryloyloxy dodecyl dihydrogen phosphate, 12-methacryloyloxy dodecyl dihydrogen phosphate, 16-acryloyloxy hexadecyl dihydrogen phosphate, 16-methacryloyloxy hexadecyl dihydrogen phosphate, 20-acryloyloxy icosyl dihydrogen phosphate, 20-methacryloyloxy icosyl dihydrogen phosphate, bis[8-acryloyloxy octyl]hydrogen phosphate, bis[8-methacryloyloxy octyl]hydrogen phosphate, bis[9-acryloyloxy nonyl]hydrogen phosphate, bis[9-methacryloyloxy nonyl] hydrogen phosphate, bis[10-acryloyloxy decyl]hydrogen phosphate, and bis[10-methacryloyloxy decyl]hydrogen phosphate; and pyrophosphoric acid esters such as pyrophosphoric acid bisoctyl, pyrophosphoric acid bis[8-acryloyloxy octyl], pyrophosphoric acid bis[8-methacryloyloxy octyl], pyrophosphoric acid bis[10-acryloyloxy decyl], and pyrophosphoric acid bis[10-methacryloyloxy decyl].

The content of the phosphonate group-containing compound or the phosphate group-containing compound in the polishing composition (in the case of containing two or more kinds, the total content thereof) is preferably 50 ppm by mass or more, more preferably 100 ppm by mass or more, further preferably 120 ppm by mass or more, further preferably 150 ppm by mass or more, further preferably 220 ppm by mass or more, further preferably 240 ppm by mass or more, further preferably 260 ppm by mass or more, and particularly preferably 270 ppm by mass or more. As the content of the phosphonate group-containing compound or the phosphate group-containing compound increases, the content of the TiN inhibitor to be adsorbed to the titanium nitride film increases, and thus the polishing speed of titanium nitride can be effectively suppressed.

The content of the phosphonate group-containing compound or the phosphate group-containing compound in the polishing composition (in the case of containing two or more kinds, the total content thereof) is also preferably 10000 ppm by mass or less, more preferably 1000 ppm by mass or less, further preferably 800 ppm by mass or less, further preferably 600 ppm by mass or less, further preferably 500 ppm by mass or less, further preferably 450 ppm by mass or less, and particularly preferably 400 ppm by mass or less. As the content of the phosphonate group-containing compound or the phosphate group-containing compound decreases, the polishing speed of the object to be polished, particularly, silicon nitride contained in the object to be polished is less likely to decrease.

The molecular weight of the phosphonate group-containing compound or the phosphate group-containing compound in the polishing composition is preferably less than 1000 and more preferably less than 600 from the viewpoint of the polishing speed of SiN. The phosphonate group-containing compound or the phosphate group-containing compound having a small molecular weight causes the polishing speed of SiN to be less likely to decrease.

Examples of the amino group-containing compound which can be used in the polishing composition include an amino acid, amino group-containing polyalkylene glycol, and aliphatic primary amine. Among these, an amino acid is particularly preferable. The amino acid indicates an organic compound having both functional groups of an amino group and a carboxyl group. Specific examples of the amino acid include glycine, α-alanine, β-alanine, N-methylglycine, N,N-dimethylglycine, 2-aminobutyric acid, norvaline, valine, leucine, norleucine, isoleucine, phenylalanine, proline, sarcosine, ornithine, lysine, taurine, serine, threonine, homoserine, tyrosine, bicine, tricine, 3,5-diiodo-tyrosine, β-(3,4-dihydroxyphenyl)-alanine, thyroxine, 4-hydroxyproline, cysteine, methionine, ethionine, lanthionine, cystathionine, cystine, cysteic acid, aspartic acid, glutamic acid, S-(carboxymethyl)-cysteine, 4-aminobutyric acid, asparagine, glutamine, azaserine, arginine, canavanine, citrulline, δ-hydroxy-lysine, creatine, histidine, 1-methyl-histidine, 3-methyl-histidine, and tryptophan. Of them, from the viewpoint of the polishing speed of SiN, a basic amino acid is more preferable, and specifically, arginine, lysine, tryptophan, histidine, and citrulline are particularly preferable. Since the pH of the polishing composition of the present invention is lower than an isoelectric point (iso-electrostatic point) of the basic amino acid, regardless of the basic amino acid being positively charged or being not charged, the phosphonate group-containing compound or the phosphate group-containing compound causes the polishing speed of SiN to be less likely to decrease.

The content of the amino group-containing compound in the polishing composition (in the case of containing two or more kinds, the total content thereof) is preferably 100 ppm by mass or more, more preferably 1000 ppm by mass or more, and further preferably 5000 ppm by mass or more. With such a range, SiN can be polished at a high polishing speed. In addition, the content of the amino group-containing compound in the polishing composition is preferably 100000 ppm by mass or less, more preferably 50000 ppm by mass or less, further preferably 20000 ppm by mass or less, and particularly preferably 10000 ppm by mass or less. With such a range, the amount of a pH adjusting agent used for adjusting pH to a target pH can be decreased, and the effect of slurry stability is obtainable.

(pH and pH Adjusting Agent)

According to an embodiment of the present invention, the pH of the polishing composition is also not particularly limited, but the lower limit thereof is preferably 1.0 or more, more preferably 1.5 or more, further preferably 1.7 or more, and particularly preferably 2.0 or more. Meanwhile, the upper limit thereof is preferably 7.0 or less, more preferably 5.0 or less, further preferably 3.0 or less, and further preferably 2.5 or less. Thus, according to an embodiment of the present invention, the pH of the polishing composition is 1.0 to 7.0. In view of the mechanism of the present invention, by employing such an embodiment, the effect of increasing selectivity during polishing is particularly significant.

As the pH adjusting agent, known acids, bases, and salts thereof can be used.

Specific examples of the acids which can be used as the pH adjusting agent include inorganic acids such as hydrochloric acid, sulfuric acid, nitric acid, hydrofluoric acid, boric acid, carbonic acid, hypophosphorous acid, phosphorous acid, and phosphoric acid, and organic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, gluconic acid, itaconic acid, tartaric acid, citric acid, lactic acid, diglycolic acid, 2-furancarboxylic acid, 2,5-furandicarboxylic acid, 3-furancarboxylic acid, 2-tetrahydrofurancarboxylic acid, methoxyacetic acid, methoxyphenylacetic acid, and phenoxyacetic acid. In a case where an inorganic acid is used as the pH adjusting agent, particularly, sulfuric acid, nitric acid, phosphoric acid, and the like are particularly preferable from the viewpoint of improving the polishing speed, and in a case where an organic acid is used as the pH adjusting agent, glycolic acid, succinic acid, maleic acid, citric acid, tartaric acid, malic acid, gluconic acid, itaconic acid, and the like are preferable.

Specific examples of the bases which can be used as the pH adjusting agent include amines such as aliphatic amine and aromatic amine, organic bases such as quaternary ammonium hydroxide, hydroxides of alkali metal such as potassium hydroxide, hydroxides of alkaline-earth metal, tetramethylammonium hydroxide, and ammonia. Among these, from the viewpoint of ease of availability, potassium hydroxide or ammonia is preferable.

The amount of the pH adjusting agent added is not particularly limited, and may be appropriately adjusted such that the polishing composition has a desired pH.

(Method for Producing Polishing Composition)

A method for producing the polishing composition according to the present invention is not particularly limited. For example, the polishing composition can be obtained by mixing and stirring silica, an anionic water-soluble polymer, a TiN inhibitor, and as necessary, other additives in a dispersant. In an embodiment, there is provided a method for producing the polishing composition, the method including mixing the silica, the anionic water-soluble polymer, the at least one compound selected from the group consisting of a phosphonate group-containing compound, a phosphate group-containing compound, and an amino group-containing compound, and the dispersing medium.

(Polishing Method)

In an embodiment, there is provided a polishing method including a step of polishing an object to be polished by using the polishing composition according to the present invention.

For example, a working slurry containing the polishing composition according to the present invention is prepared. Next, the polishing composition is supplied to an object to be polished and the object to be polished is polished by a general method. For example, the object to be polished is set in a general polishing apparatus, and the polishing composition is supplied to the surface of the object to be polished (surface to be polished) through a polishing pad of the polishing apparatus. Typically, while the polishing composition is continuously supplied, the polishing pad is pressed against the surface of the object to be polished and the polishing pad and the object to be polished are relatively moved (for example, rotationally moved). The object to be polished is subjected to this polishing step, whereby polishing of the object to be polished ends.

The polishing pad used in the polishing step is not particularly limited. For example, any polishing pad of a foamed polyurethane type, a non-woven fabric type, a suede type, including abrasive grains, and not including abrasive grains can be used. In addition, as the polishing apparatus, a double-side polishing apparatus which polishes both surfaces of the object to be polished may be used or a single-side polishing apparatus which polishes only one surface of the object to be polished may be used.

The polishing composition may be used in an embodiment in which the polishing composition once used is discarded (so-called "discarded after single use") or may be repeatedly used in recycle. One example of the method of using the polishing composition in recycle includes collecting the polishing composition after use, which is discharged from the polishing apparatus into a tank, and supplying the collected polishing composition to the polishing apparatus again. In a case where the polishing composition is used in recycle, the amount of the polishing composition after use, which is dealt with as wasted liquid, can be reduced as compared with the case of being discarded after single use, and thus environmental load can be reduced. Further, since the amount of the polishing composition used is reduced, the cost can be reduced.

Herein, in an embodiment, it is preferable that the object to be polished contains silicon nitride and titanium nitride.

(Method for Producing Semiconductor Substrate)

In an embodiment, there is provided a method for producing a semiconductor substrate, the method including a step of polishing an object to be polished by the polishing method.

Although the embodiments of the present invention have been described in detail, these are descriptive and illustrative rather than limited, and it is apparent that the scope of the present invention has to be understood with the appended claims.

The present invention includes the following aspects and embodiments.

1. A polishing composition containing:
   silica;
   an anionic water-soluble polymer;
   at least one compound selected from the group consisting of a phosphonate group-containing compound, a phosphate group-containing compound, and an amino group-containing compound; and
   a dispersing medium.
2. The polishing composition described in the item 1, in which pH is 1.0 to 7.0.
3. The polishing composition described in the item 1 or 2, in which the anionic water-soluble polymer is polycarboxylic acid.
4. The polishing composition described in any one of the items 1 to 3, in which the phosphonate group-containing compound has one to six phosphonate groups.
5. The polishing composition described in any one of the items 1 to 4, in which the phosphonate group-containing compound is at least one selected from the group consisting of nitrilotris(methylenephosphonic acid), ethylenediamine tetramethylene phosphonic acid, and diethylenetriamine penta(methylenephosphonic acid).
6. The polishing composition described in any one of the items 1 to 5, in which the phosphate group-containing compound is at least one selected from the group consisting of an inorganic phosphoric acid compound and an organic phosphoric acid compound.
7. The polishing composition described in any one of the items 1 to 6, in which the amino group-containing compound is an amino acid.
8. The polishing composition described in any one of the items 1 to 7, in which the polishing composition is used in a step of polishing an object to be polished containing silicon nitride and titanium nitride.
9. A method for producing the polishing composition described in any one of the items 1 to 8, the method including mixing the silica, the anionic water-soluble polymer, the at least one compound selected from the group consisting of a phosphonate group-containing compound, a phosphate group-containing compound, and an amino group-containing compound, and the dispersing medium.
10. A polishing method including a step of polishing an object to be polished by using the polishing composition described in any one of the items 1 to 8.
11. The polishing method described in the item 10, in which the object to be polished contains silicon nitride and titanium nitride.
12. A method for producing a semiconductor substrate, the method including a step of polishing an object to be polished by the polishing method described in the item 10 or 11.

EXAMPLES

The present invention will be described in more detail using the following Examples and Comparative Examples. However, the technical scope of the present invention is not intended to be limited only to the following Examples. Incidentally, unless specifically described otherwise, "ppm," "%," and "part (s)" mean "parts per million by mass," "% by mass," and "part(s) by mass," respectively.

(Preparation of Polishing Composition)

Preparation of Polishing Composition of Example 1

2% by mass of colloidal silica (average primary particle size: 12 nm; average secondary particle size: 30 nm) with respect to the final polishing composition, 3200 ppm of polyacrylic acid (Mw=5000) with respect to the final polishing composition, and 50 ppm of diethylenetriamine penta (methylenephosphonic acid) (DTPMP) with respect to the final polishing composition were added and an aqueous solution of nitric acid (70%) and water (ultrapure water) were added such that a pH of the polishing composition would be 2.2, thereby preparing a polishing composition of Example 1. The pH value of the polishing composition of Example 1 (liquid temperature: 25° C.) was confirmed by a pH meter (model: LAQUA (registered trademark) manufactured by HORIBA, Ltd.).

Preparation of Polishing Compositions of Examples 2 to 23 and Comparative Examples 1 to 4

Polishing compositions of respective Examples and Comparative Examples were prepared in the similar manner to preparation of the polishing composition of Example 1, except that the type and/or content of each component were changed as presented in the following Table 1. Incidentally, "-" in the table indicates that the corresponding component was not used.

(CMP Process)

The silicon nitride substrate and the titanium nitride substrate serving as the semiconductor substrates were polished using the polishing composition of each of Examples 1 to 23 and Comparative Examples 1 to 4 under the following conditions. Herein, as the silicon nitride substrate and the titanium nitride substrate, a 300-mm wafer was used.

(Polishing Apparatus and Polishing Conditions)

Polishing apparatus: FREX (registered trademark) 300E manufactured by EBARA CORPORATION Polishing pad: Dow IC1400

Polishing pressure: 2.0 psi (1 psi=6894.76 Pa, the same applies hereafter)

Rotation number of polishing table: 60 rpm

Rotation number of head: 61 rpm

Supply of polishing composition: discarded after single use

Supply amount of polishing composition: 300 ml/min

Polishing time: for 30 seconds (Polishing Speed Evaluation)

The polishing speed of each object to be polished after polishing described above was obtained using the following Equation 1. The evaluation results are collectively presented in Table 1.

[Math. 1]

$$\text{Polishing speed (nm/min)} = \frac{[\text{Thickness (nm) of substrate before polishing}] - [\text{Thickness (nm) of substrate after polishing}]}{[\text{Treatment time (min)}]} \quad \text{Equation 1}$$

In addition, in Examples, evaluation was performed using each of the silicon nitride substrate and the titanium nitride substrate, but even in the case of using a substrate containing silicon nitride and titanium nitride, or the like, it is speculated that the same result as described above is obtained.

TABLE 1

| | Anionic water-soluble polymer | | | TiN inhibitor | | | SiN polishing speed (nm/min) | TiN polishing speed (nm/min) | SiN/TiN selectivity |
|---|---|---|---|---|---|---|---|---|---|
| | Type | Mw | Content (ppm) | Type | Number of phosphate groups | Content (ppm) | | | |
| Example 1 | Polyacrylic acid | 5000 | 3200 | DTPMP | 5 | 50 | 503 | 438 | 1.15 |
| Example 2 | Polyacrylic acid | 5000 | 3200 | DTPMP | 5 | 100 | 479 | 358 | 1.34 |
| Example 3 | Polyacrylic acid | 5000 | 3200 | DTPMP | 5 | 150 | 457 | 13 | 35.15 |
| Example 4 | Polyacrylic acid | 5000 | 3200 | DTPMP | 5 | 180 | 444 | 11 | 40.36 |
| Example 5 | Polyacrylic acid | 5000 | 3200 | DTPMP | 5 | 210 | 434 | 9 | 48.22 |
| Example 6 | Polyacrylic acid | 5000 | 3200 | DTPMP | 5 | 240 | 426 | 7 | 60.86 |
| Example 7 | Polyacrylic acid | 5000 | 3200 | DTPMP | 5 | 270 | 419 | 4 | 104.75 |
| Example 8 | Polyacrylic acid | 5000 | 3200 | DTPMP | 5 | 300 | 417 | 2.3 | 181.30 |
| Example 9 | Polyacrylic acid | 5000 | 3200 | DTPMP | 5 | 400 | 360 | 2.8 | 130.27 |
| Example 10 | Polyacrylic acid | 5000 | 3200 | DTPMP | 5 | 500 | 341 | 3.5 | 98.94 |
| Example 11 | Polyacrylic acid | 2000 | 3200 | DTPMP | 5 | 300 | 356 | 99 | 3.60 |
| Example 12 | Sodium polyacrylate | 3000 | 3200 | DTPMP | 5 | 300 | 377 | 174 | 2.17 |
| Example 13 | Ammonium polyacrylate | 6000 | 3200 | DTPMP | 5 | 300 | 353 | 98 | 3.60 |
| Example 14 | Ammonium polyacrylate | 10000 | 3200 | DTPMP | 5 | 300 | 359 | 193 | 1.86 |
| Example 15 | (Acrylic acid-maleic acid) salt copolymer | 2800 | 3200 | DTPMP | 5 | 300 | 325 | 18 | 18.06 |
| Example 16 | Polyacrylic acid | 5000 | 3200 | EDTMP | 4 | 300 | 379 | 26 | 14.85 |
| Example 17 | Polyacrylic acid | 5000 | 3200 | NTMP | 3 | 1550 | 366 | 73 | 5.03 |

TABLE 1-continued

| | Anionic water-soluble polymer | | | TiN inhibitor | | SiN polishing speed (nm/min) | TiN polishing speed (nm/min) | SiN/TiN selectivity |
| | Type | Mw | Content (ppm) | Type | Number of phosphate groups | Content (ppm) | | | |
| --- | --- | --- | --- | --- | --- | --- | --- | --- | --- |
| Example 18 | Polyacrylic acid | 5000 | 3200 | HEDP | 2 | 1730 | 427 | 79 | 5.39 |
| Example 19 | Polyacrylic acid | 5000 | 3200 | Phenyl phosphonic acid | 1 | 1860 | 541 | 283 | 1.91 |
| Example 20 | Polyacrylic acid | 5000 | 3200 | Arginine | — | 9900 | 442 | 52 | 8.45 |
| Example 21 | Polyacrylic acid | 5000 | 1600 | Arginine | — | 8000 | 476 | 72 | 6.61 |
| Example 22 | Polyacrylic acid | 5000 | 1600 | Arginine | — | 4000 | 548 | 134 | 4.09 |
| Example 23 | Polyacrylic acid | 5000 | 1600 | Arginine | — | 2000 | 519 | 214 | 2.42 |
| Comparative Example 1 | Polyacrylic acid | 5000 | 3200 | — | — | — | 535 | 542 | 0.99 |
| Comparative Example 2 | — | — | — | DTPMP | 5 | 300 | 309 | 480 | 0.64 |
| Comparative Example 3 | — | — | — | Arginine | — | 8000 | 408 | 545 | 0.75 |
| Comparative Example 4 | — | — | — | — | — | — | 456 | 665 | 0.69 |

From the results of Table 1, it was found that in Examples 1 to 23 using the polishing composition of the present invention, the polishing speed of silicon nitride with respect to the polishing speed of titanium nitride (SiN/TiN selectivity) is sufficiently high. On the other hand, in Comparative Examples 1 to 4 not having at least one of the anionic water-soluble polymer and the TiN inhibitor, the SiN/TiN selectivity was low. In addition, it was found that among Examples, the result of Example 8 using DTPMP is extremely excellent.

The present application is based on Japanese Patent Application No. 2017-185460 filed on Sep. 26, 2017, and a disclosed content thereof is incorporated herein as a whole by reference.

What is claimed is:

1. A polishing composition comprising:
    silica;
    an anionic water-soluble polymer;
    diethylenetriamine penta(methylenephosphonic acid) present at a concentration of 50 ppm or more and 500 ppm or less; and
    a dispersing medium,
    wherein a content of the anionic water-soluble polymer is 1600 ppm or more, a weight average molecular weight of the anionic water-soluble polymer is 1000 or more, and a pH of the polishing composition is 2.5 or less.

2. The polishing composition according to claim 1, wherein the pH is 1.0 or more.

3. The polishing composition according to claim 1, wherein the anionic water-soluble polymer is a polycarboxylic acid.

4. The polishing composition of claim 3, wherein the polycarboxylic acid is selected from poly(meth)acrylic acid, a (meth)acrylic acid-maleic acid copolymer, and salts thereof.

5. The polishing composition according to claim 1, wherein the polishing composition is used in a step of polishing an object to be polished containing silicon nitride and titanium nitride.

6. The polishing composition of claim 1, wherein the weight average molecular weight of the anionic water-soluble polymer is 10,000 or less.

7. A method for producing the polishing composition according to claim 1, the method comprising mixing the silica, the anionic water-soluble polymer, the at least one compound selected from the group consisting of a phosphonate group-containing compound having one to six phosphonate groups, and the dispersing medium.

8. A polishing method comprising a step of polishing an object to be polished by using the polishing composition according to claim 1.

9. The polishing method according to claim 8, wherein the object to be polished contains silicon nitride and titanium nitride.

10. A method for producing a semiconductor substrate, the method comprising a step of polishing an object to be polished by the polishing method according to claim 8.

* * * * *